(12) United States Patent
Diglio et al.

(10) Patent No.: US 9,638,747 B2
(45) Date of Patent: May 2, 2017

(54) PLACING INTEGRATED CIRCUIT DEVICES USING PERTURBATION

(71) Applicants: Paul J. Diglio, Chandler, AZ (US); Nader N. Abazarnia, Chandler, AZ (US); Christopher R. Schroeder, Gilbert, AZ (US); Rene J. Sanchez, Chandler, AZ (US); Morten S. Jensen, Mesa, AZ (US)

(72) Inventors: Paul J. Diglio, Chandler, AZ (US); Nader N. Abazarnia, Chandler, AZ (US); Christopher R. Schroeder, Gilbert, AZ (US); Rene J. Sanchez, Chandler, AZ (US); Morten S. Jensen, Mesa, AZ (US)

(73) Assignee: Intel Corporation, Santa Clara, CA (US)

( * ) Notice: Subject to any disclaimer, the term of this patent is extended or adjusted under 35 U.S.C. 154(b) by 132 days.

(21) Appl. No.: 14/141,718

(22) Filed: Dec. 27, 2013

(65) Prior Publication Data

US 2015/0185281 A1    Jul. 2, 2015

(51) Int. Cl.
*G01R 31/28*   (2006.01)
*G01R 1/04*    (2006.01)

(52) U.S. Cl.
CPC ....... *G01R 31/2893* (2013.01); *G01R 1/0466* (2013.01)

(58) Field of Classification Search
CPC  G01R 1/0408; G01R 1/0483; G01R 1/06794; G01R 31/2887; G01R 31/2889; G01R 31/2896; G01R 31/2851; G01R 31/2886; H01R 13/6315; H05K 1/0268; G01B 7/31; G01B 13/6315
USPC ...................................... 324/750
See application file for complete search history.

(56) References Cited

U.S. PATENT DOCUMENTS

| | | | |
|---|---|---|---|
| 5,129,874 A * | 7/1992 | Hayes et al. | 493/167 |
| 5,172,050 A * | 12/1992 | Swapp | 324/750.03 |
| 6,472,891 B1 * | 10/2002 | Tran | 324/756.02 |
| 6,924,656 B2 * | 8/2005 | Matsumoto | 324/750.19 |
| 2003/0222636 A1 * | 12/2003 | Fujishiro et al. | 324/158.1 |
| 2004/0119487 A1 * | 6/2004 | Song et al. | 324/758 |
| 2006/0089016 A1 * | 4/2006 | Xie | H05K 7/1061 439/71 |
| 2006/0158179 A1 * | 7/2006 | Chyan | 324/158.1 |
| 2006/0181291 A1 * | 8/2006 | Atwood | 324/754 |
| 2011/0193581 A1 * | 8/2011 | Amaro et al. | 324/754.03 |
| 2012/0074975 A1 * | 3/2012 | Detofsky et al. | 324/750.17 |

* cited by examiner

*Primary Examiner* — Son Le
*Assistant Examiner* — Akm Zakaria
(74) *Attorney, Agent, or Firm* — Blakely, Sokoloff, Taylor & Zafman LLP

(57) ABSTRACT

Placing integrated circuit devices using a perturbation is described. In one example, a testing platform has a circuit board. A socket is on the board for receiving and connecting to an integrated circuit package. The socket has an array of pins to engage connection bumps on a surface of the package and a biasing feature to guide the package into alignment with the pins of the socket. A perturbation source induces movement of the package into alignment with the pins of the socket.

20 Claims, 6 Drawing Sheets

PLACING INTEGRATED CIRCUIT DEVICES USING PERTURBATION

FIELD

The present description relates to placing integrated circuit packages and, in particular, to aligning a package into a fixture using perturbation.

BACKGROUND

In the manufacture of packaged integrated circuit chips, the packaged chips are placed in a socket of a test fixture for testing. The packages have an array of connection bumps or balls on one side. The socket has an array of pins that connect to the bumps or balls when the package is placed into the socket. The test fixture applies signals to some of the pins and receives signals from other pins to perform a variety of different tests. Some packages have connectors on the top of the package as well as on the bottom. To test such a package some test fixtures have an upper plate with another set of pins that is attached over the package after the package is mounted in the bottom socket.

In package testing, it is important that the package be properly aligned so that the proper bumps or balls connect with the intended pins. Technology is trending to smaller solder bump pitch sizes. The bump pitch refers to the number of bumps in a particular amount of space on a connection surface of the package. As the pitch increases, the bumps are closer together. Bump pitch is increasing in order to increase the number of connections and to reduce the size of the integrated circuit packages. The smaller and more numerous connections make it more difficult to properly mount a package in a socket.

In many sockets, the integrated circuit chip package is aligned to the socket using the edge of the package as a mechanical reference. As the package is dropped into the socket, its edge follows a chamfered surface that guides the package into place.

BRIEF DESCRIPTION OF THE DRAWING FIGURES

Embodiments of the invention are illustrated by way of example, and not by way of limitation, in the figures of the accompanying drawings in which like reference numerals refer to similar elements.

DETAILED DESCRIPTION

Rather than using the package edge as a reference to the position of the package solder bumps, the solder bumps themselves may be used as the reference. As described herein, the desired location of the package may be defined to be the lowest energy position within the socket. A biasing feature may be used to help guide the package to this lowest energy position. The package may then be translated to this position. The part may be translated by physical vibration, air pressure, or another physical disturbance. While the techniques are demonstrated using solder bumps, any package feature with a z-axis dimension may be used including pins, pads, lands, and indented features.

When the edge of the package is used as a reference, the distance between the solder bumps and the package edge must be precisely controlled. The manufacturing tolerance for this distance is determined by the assembly process. If the connection bumps are not within the correct distance tolerance from all four edges of the package, then the package bumps will not be properly aligned. The position of the die with respect to the packet edge depends on many different parts of the packaging process and is difficult to accurately control.

Higher accuracy requires more expensive packaging processes. In addition for packages that will not be socketed except for test, the position of the bumps relative to the package is important only for testing. As a result, this additional expense could otherwise be avoided.

Figure 1:
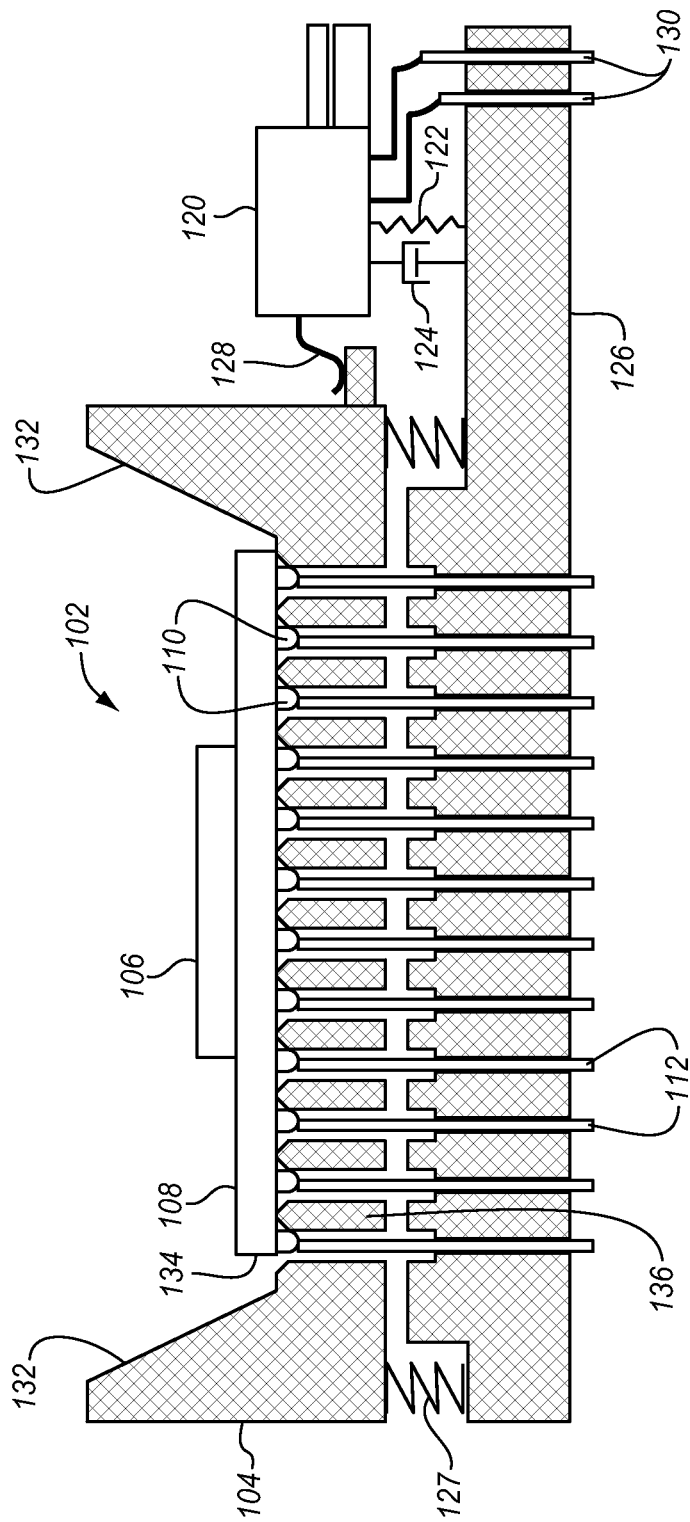
FIG. 1 is a cross-sectional side view diagram of a portion of an integrated circuit package test system according to an embodiment of the invention.

FIG. 1, shows a cross-sectional view of a portion of a test system. A silicon device 102 is placed in a socket 104. The silicon device in this example is a die 106 mounted to a package substrate 108. This combination of die and package is also referred to as a chip. The die may have multiple electronic system function and then be referred to as a system on a chip (SoC). The package may have multiple dies attached to a single substrate also referred to as a system in a package (SiP).

The device for this description is the device under test (DUT) for the test system and is to be tested in the socket. The nature and timing of the test will vary, depending on the particular implementation. In one example, the device is a surface mount technology (SMT) package with an array of solder bumps 110 on the package substrate. These bumps will be at least partially melted when the device is mounted to a circuit board but may be used as connection bumps in the socket for testing purposes. In this way the device may be tested before it is mounted or even shipped to a systems integrator for its end purpose.

Only a small portion of the test system is shown. The test system may have multiple sockets to simultaneously test many DUTs, the sockets may be mounted to a motherboard or a load board. The test system may also include a TIU (Test Interface Unit). The socket has an array of pins 112. Each pin is positioned to make an electrical connection with one of the solder bumps. Different sockets may be used for devices that have different solder ball configurations.

In this example an off balance motor 120 with a known spring coefficient 122, mass, and damper rate 124 is attached to a socket base 126. The base also carries the socket. The motor introduces a perturbation to the package and ball guide system (without socket load) with the ball-guides biasing the part to the lowest energy state defined simply by gravity. Alternatively, a voice coil motor, solenoid motor, reciprocating piston, or any other source of perturbation may be used. As described below, the socket move primarily in the vertical direction or on the z-axis as shown in FIG. 1, accordingly, the perturbation source is selected to provide a vertical movement.

FIG. 1 also shows that the socket 104 floats over a socket base 126. The motor is attached to the base but it drives the socket 104 through a connecting stylus 128. The drive current of the off-balance or perturbation drive motor is routed through surface contact spring probes 130. The contacts connect from the motor through the socket base to which the motor is attached.

The contact spring probes are able to move with a spring effect as the motor moves with respect to the socket base. This eliminates the need for fragile wires and soldering during assembly or for removal and repair activities. The spring probes can then be supplied with 1.8, 3.3 or 5v TTL logic sources commonly available on test interface boards. The spring probes are not necessarily large and do not significantly limit the movement of the spring mounted motor because the drive current for this kind of motor is typically lower than 20 mA. The spring probes also allow for quick integration into existing device test sequence control hardware and software.

The motor 120 is mounted to the socket base 126. The socket 104 is mounted to the socket base 126 with springs 127. The motor has a stylus 128 that contacts the socket. As a result, the motor induces a positional translation between the socket base attached to the motor and the socket that is attached to the stylus. The springs allow the socket to move with respect to the socket base, however, horizontal movement is constrained by connection dowels of the socket (not shown). The springs and the dowel pins allow the socket to move vertically, in response to the perturbation motor but prevent it from moving horizontally. With this vertical excitement, the socket will translate its vertical movement to the package. The package will move in all three directions because of imperfections in the weight distribution of the package and because of angles and curves in the surfaces of the package and the socket.

The springs 127 also allow the die to be pushed down against the socket with a clamp. This allows the socket pins to be exposed through the socket to present pressure against the solder bumps and ensure electrical contact.

In order to align the solder bumps 110 of the device 102 with the connection pins 112 of the socket 104, the socket has a package guide system and a ball guide system. There is an established lowest energy position that coincides with accurate alignment. A biasing feature, such as a vacuum, chamfer, angled guides, or lead-ins may be used to help guide the device into the socket. The package exposed to the biasing feature moves to the lowest energy position when exposed to a force sufficient to overcome the coefficient of static friction between the device and the socket. Such a force may be applied by a perturbation inducer or by an off-balance motor, or any other perturbation directed towards the socket. This perturbation may be induced in multiple directions (x, y, and z-axes) depending on the particular implementation.

In a conventional package guide system angled side walls 132 of the socket are used to guide the package into alignment with the socket pins. The angled side walls contact the outside edges 134 of the packet. If the packet edge contacts a side wall, then the side wall will push the package toward the middle of the socket.

Figure 2:
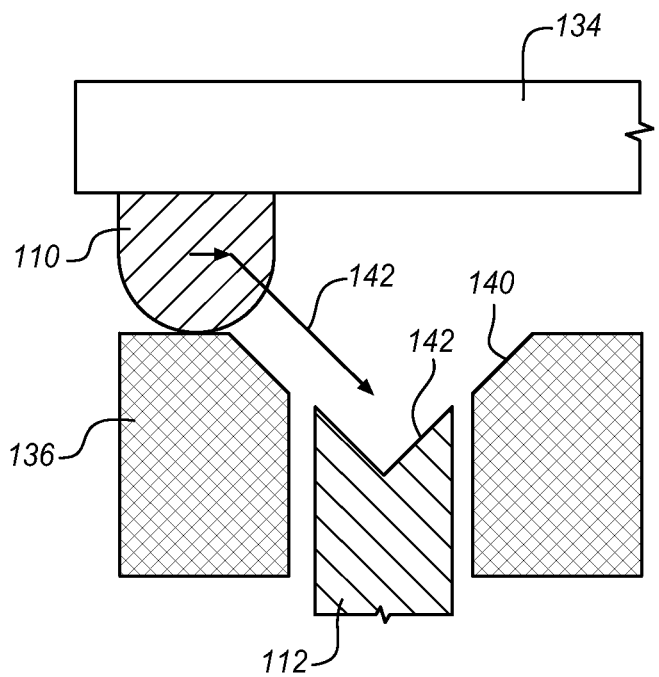
FIG. 2 is an enlarged cross-sectional side view diagram of a package and a socket according to an embodiment of the invention.
Figure 3:
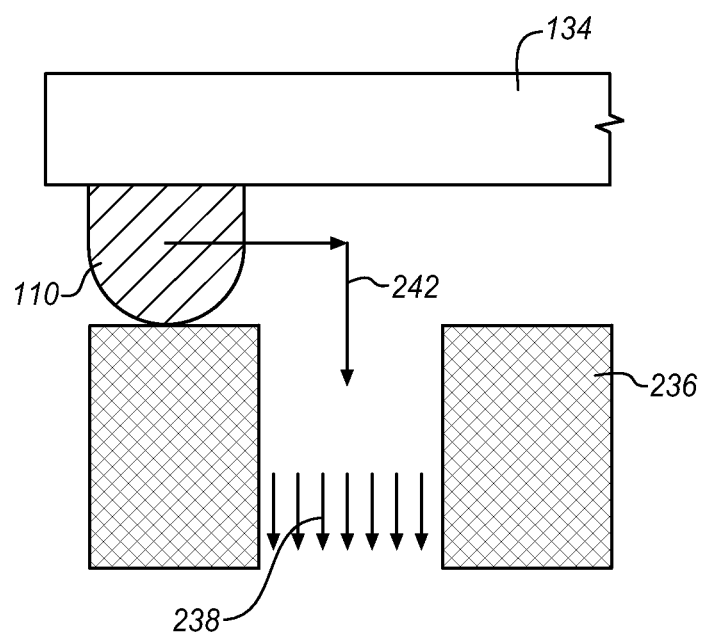
FIG. 3 is a an enlarged cross-sectional side view diagram of a package and an alternative socket according to an embodiment of the invention.

For finer pitch packages, the package side walls are not accurate enough. If the bumps or connection grid on the package are too small, then they will not be aligned with the package edge with enough accuracy to guide the connection to the correct pins, i.e. to the lowest energy state. As shown in FIGS. 1, 2, and 3, for parts with a finer bump pitch, the package edge is used only as a rough aligning mechanism. Once the part is within a reasonable tolerance of alignment with the socket, the package edges are no longer used for alignment. This prevents the package edges from restricting the bumps and pins from being aligned by the perturbation and biasing mechanism. Compared to a conventional test socket, the edge guides of the socket can be constructed farther from the package edge and farther from the socket edge guide on the opposite side of the packet.

The ball guide system guides the balls, bumps, or connection grid 110 on the package 134 to the correct pin 112. In the illustrated example, each pin 112 of the socket extends from the socket base 104 through a shaft 136 in the socket to contact a respective ball. The side walls of the shaft end in a guide surface 140 which is better shown in FIG. 2.

FIG. 2 is an enlarged cross-sectional side view of a socket pin 112 within a shaft 136 of the socket. The top of the shaft has a guide surface 140 in the form of a beveled edge. The top end of the shaft at both sides is beveled near the socket pin 112. In addition, the socket pin has a chamfer at its end to guide the solder bump to the center of the pin. The beveled surfaces appear as flat surfaces in the cross section of FIG. 2 and may be chamfers or flat-surfaced grooves. However, for a round pin 112 and a cylindrical shaft 136, the surfaces may instead be rounded so that the bevels are rounded conical surfaces that guide the solder bump to the center of the socket pin from all directions.

Considering the example of FIG. 2, the package 134, placed above the socket and the socket pins 112, is misaligned with the socket pins. As shown, the socket is in an energy state above the socket pin that is higher energy than alignment with the pins. The energy E may be expressed as $E=mgh$, the product of the mass of the package m, the force of gravity g, and the height of the package h above the optimal position. A perturbation of the package to the right as shown in the drawing will cause the package to move to the guide surface and move along the guide surface to the lowest energy position as shown by the arrows. This move will land the solder bump onto the socket pin. As h decreases, E decreases until h reaches a minimum value which corresponds to the bump being in the shaft.

While the desired package movement in FIG. 2 is only to the right, in a typical application, the system will not know which way to move the package. By applying a perturbation in multiple directions, the package may be moved in multiple directions. Typically a perturbation in any one direction will result in a randomized movement of the package in multiple directions that is capable of translating the package into alignment with the socket. The amount of kinetic energy applied to the package by the perturbation source, in this case the motor is selected based on the parameters of the system. Too little energy will not move the package far enough. Too much kinetic energy will bounce the package out of the socket. The correct amount of energy is enough to cause enough movement to move the package to only a slightly higher energy state, and to allow the package to the lower energy state. If the package is perturbed in multiple directions, then it may respond to movement in one of the directions by moving to the lower energy state. Movement in the other directions will not transition the energy of the package.

The lowest energy state of the system, the system being the device and the socket, coincides with the solder bumps or balls being accurately aligned to the socket pins. The system has a biasing feature to help guide the system to the lowest energy state. In the example of FIG. 2, gravity is used to define the lowest energy state and the guide surfaces bias the motion of the system into the lowest energy state.

FIG. 3 is a cross-sectional diagram of an enlarged part of the socket and package using an alternative biasing system. In the example of FIG. 3, the package 134 has been placed over the socket in rough alignment. The package has solder bumps 110 that are out of alignment with the socket pins (not shown). In this example, gravity is also used to find the lowest energy point. The biasing means, however, is not beveled surfaces but a vacuum 238 to help bias and pull the silicon device to the correct location.

As the package is subjected to a perturbation, the socket will move about on the side walls of the socket pin shaft 236. The vacuum will draw the solder bumps toward the shaft in a direction as shown by the arrow 242 and eventually sink into the opening 236. After the package is in place in the socket, then the package is clamped into place. The socket will be pushed down with the package, and the solder balls will be pushed down with the socket to connect with the socket pins. The solder bumps will already be drawn below the hole by the vacuum prior to the package being clamped. The clamping force will pull the pins to the solder bumps. The lowest energy point and the biasing features may be implemented in a variety of other ways to suit different application and testing fixtures.

The operation of the perturbation source may be improved by tuning the amplitude and frequency of the vibration for a particular socket and die. On the one hand, the vibrational input must be enough to cause the die to move into the lowest energy state. On the other hand, excessive transfer of vibrational energy from the actuator to the device may cause the die to move away from the ball pin guide, move away from the lowest energy state or simply bounce out of the socket.

The movement of the silicon device is aided when the perturbation is applied in a random fashion to allow the biasing feature to guide the device to the lowest energy state already defined. A perturbation or vibration may be applied to the system to release the surface friction of the die relative to the socket. The perturbation may be used to move the die randomly and allow the other elements to accurately align the device.

The parameters of frequency and amplitude may be determined in a variety of different ways. In one embodiment, the natural frequency for the combination of the test socket ball and pin guide (mass, m1 and spring constant, k1) may be calculated or measured. The natural frequency (m2, k2) of the driver match may then be selected. For the off-balance motor, the driver oscillating frequency and amplitude can be mapped to an RPM (Revolutions per Minute) of the motor. For a voice coil, solenoid, or pneumatic system, other parameters may be mapped. The RPM may be selected to match the desired parameters. The RPM determined by matching m1, k1 will provide the maximum possible excitation of the ball, pin guide combination. From the maximum, the system can be detuned to reduce the amount of excitation. This may be done, for example, by changing m2, k2, perturbation amplitude, or perturbation frequency to a point that the perturbational energy is low enough to move the socket without ejecting the device bumps from the ball/pin guide.

The perturbation energy of the test system can be tuned by changing the amplitude of the ball and pin guide vibration. Many different system parameters may be adjusted. These include the forcing function as determined by the motor RPM. The motor voltage and drive current can be changed. For a pulse width modulation (PWM) motor driver, the drive current pulse width may be adjusted. The frequency mismatch between the driver and the ball and pin guide combination may be adjusted. The mass and spring parameters of the driver may also be changed by using different materials.

In use, the system applies a perturbation for some length of time. After the package is aligned in the socket, the perturbation stops. The package is then clamped into the socket and the package is tested. The perturbation may stop based on a timer or based on a detection that the package is in place. For a timer system, the necessary period of perturbation time for the alignment may be determined empirically. One technique is to use video to determine alignment and then run multiple trials of packages and sockets. The video can be used in an experimental or production system to determine when the package moved to alignment. An appropriate period of perturbation time may then be selected that will be sufficient in most cases to move the package into position.

An alternative technique for inducing vibration in a package, socket system is to attach a surface transducer, such as a voice coil to the printed circuit board (PCB) on which the socket is mounted. As mentioned above, a voice coil may also be used directly on the socket as the motor is used in FIG. 1. The voice coil has an electromagnetic wound coil that surrounds a permanent magnet core. If an alternating current is applied to the coil, then the core will cycle back and forth in its path in alternating directions like a solenoid. The frequency and the amplitude of the movement of the cores may be adjusted by adjusting the frequency and amplitude of the input signal.

Figure 4:
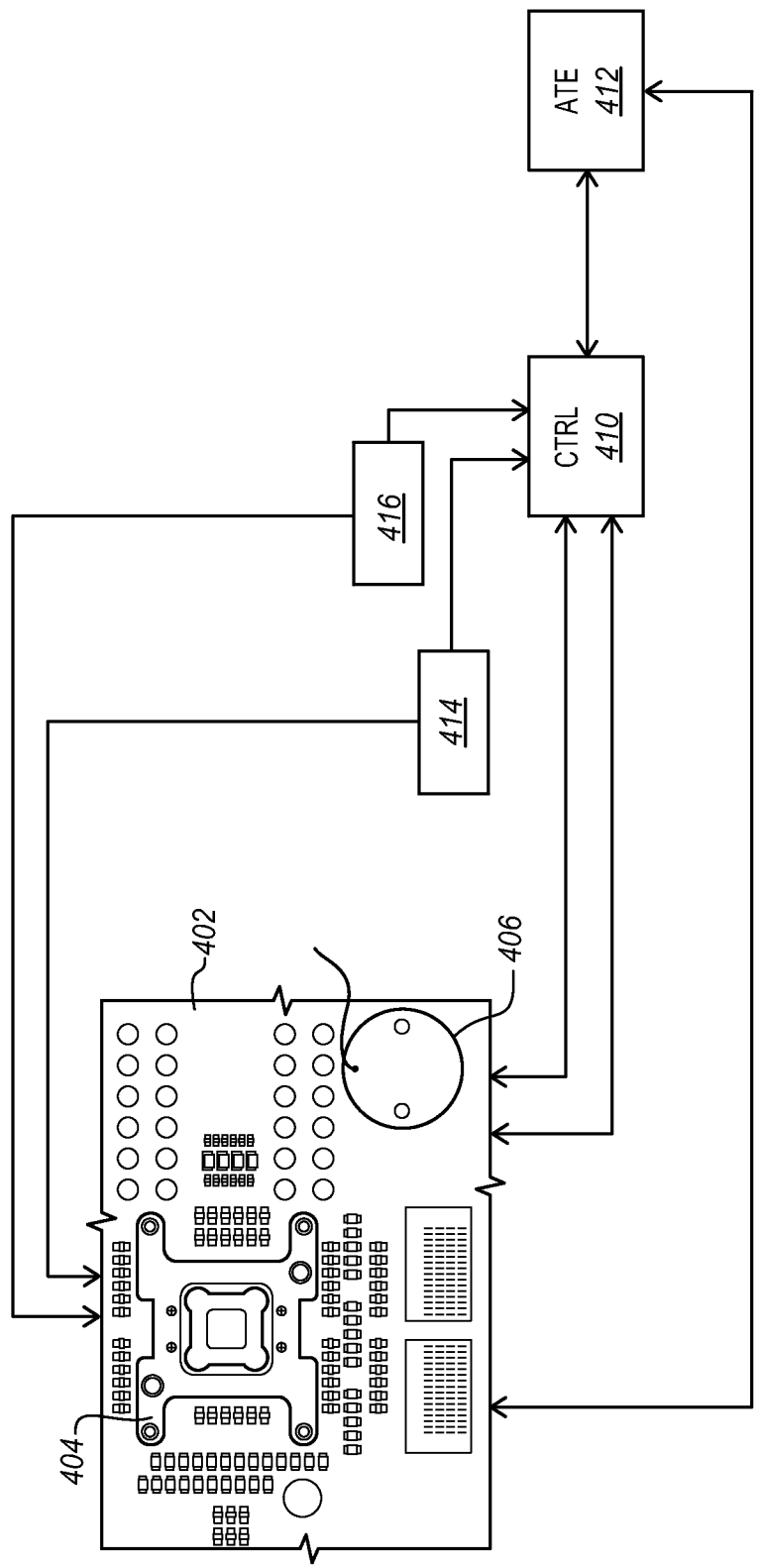
FIG. 4 is a diagram of a test system using a perturbation motor and a test socket according to an embodiment of the invention.

FIG. 4 is an isometric view of a PCB 402 of a package test system. The PCB has one or more sockets 404 mounted to it, typically by being soldered into place. The PCB carries test signal and power to the sockets and allows for a connection to a test controller. The socket base 126 of FIG. 1 or any other suitable type of socket may be mounted to a similar type of PCB either with other sockets or alone. A voice coil 406 is mounted to the PCB without directly contacting the socket. A perturbation source may also or alternatively be mounted in any other area of the tool. The location and mounting system are selected so that there is enough perturbation at the socket to align the package into the socket. In this way, a single perturbation inducer may be used for multiple sockets. In current test tools, there may be thirty or more sockets on a load board.

The test system of FIG. 4 may also include other components, such as a controller 410 coupled to the PCB. The controller drives the voice coil and engages and disengages its action. The controller may also be coupled to a vacuum or other biasing system 414 to drive the bias or guide.

The controller may also be coupled to an alignment response system 416 to determine when the package is aligned with the socket. The response system may be a vacuum detector, electrical detector, capacitive detector, optical detector or any other desired detector. The detector may be used as a feedback sensor to determine whether the package is in alignment with the socket. This may be done by detecting an electrical connection with the solder bumps, or in any other way. A vacuum sensor may operate by detecting a change in vacuum pressure through the holes in the socket. The holes may be the shafts that are partially blocked by the solder bumps or they may be some other holes in the socket that would indicate that the package has moved to the lowest energy position.

When alignment is detected, then the feedback sensor generates an alignment signal in response. The alignment signal is applied to the controller. This may be a main test system controller as shown or a special perturbation system controller. The controller is coupled to the feedback sensor to receive the alignment signal. In response to receiving the alignment signal, the controller deactivates the perturbation source. In the example of FIG. 4, the controller is coupled to the voice coil to engage and disengage the voice coil.

The controller may also be coupled to an ATE (Automated Test Equipment) or other system. The controller can indicate that the package is ready for testing. The ATE in response can then perform any desired tests on the package.

When the perturbation transducer 406 is driven at the fundamental harmonics of the PCB and socket system, standing wave modes are induced which cause the package to move laterally in the socket until it drops into the low energy position. Different vibrational modes may be used to bias the direction of the device travel or to make it neutral. By attaching a vibrational transducer directly to the PCB, a vibration system may be introduced without changing the PCB. In addition, the complexity of the spring motions of FIG. 1 may also be avoided.

In many test systems, there are many sockets and they will not all arrive at alignment at the same time. A timer may be set to allow the perturbation to continue long enough that a typical worst case package alignment will come into alignment. For a detection system, the perturbation system may continue until alignment is detected for all packages. A timer and a feedback sensor may be combined so that the perturbation continues as long as the timer allows unless the feedback signal is received. The expiration of the timer may then be used as an alert that requires correction of an error condition.

Figure 5:
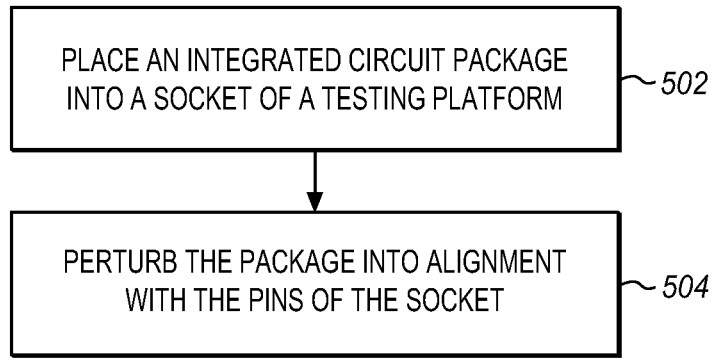
FIG. 5 is a process flow diagram of placing an integrated circuit package using a perturbation according to an embodiment of the invention.

FIG. 5 is a simplified process flow diagram for operating a package alignment system as described herein. At 502, an integrated circuit package is placed into a socket of the testing platform. As described herein, the package has an array of connection bumps on one surface and this surface is directed toward the socket. The socket is mounted to a circuit board of the testing platform. The socket has an array of pins to engage the connection bumps on the package. The socket also has a biasing feature to guide the package into alignment with the pins of the socket.

At 504, the package is perturbed into alignment with the pins of the socket. In some examples herein, the socket is vibrated to perturb the package. This allows the biasing features to guide the package in a lowest energy position with respect to the socket. By design, the lowest energy position corresponds to alignment with the pins of the socket.

Figure 6:
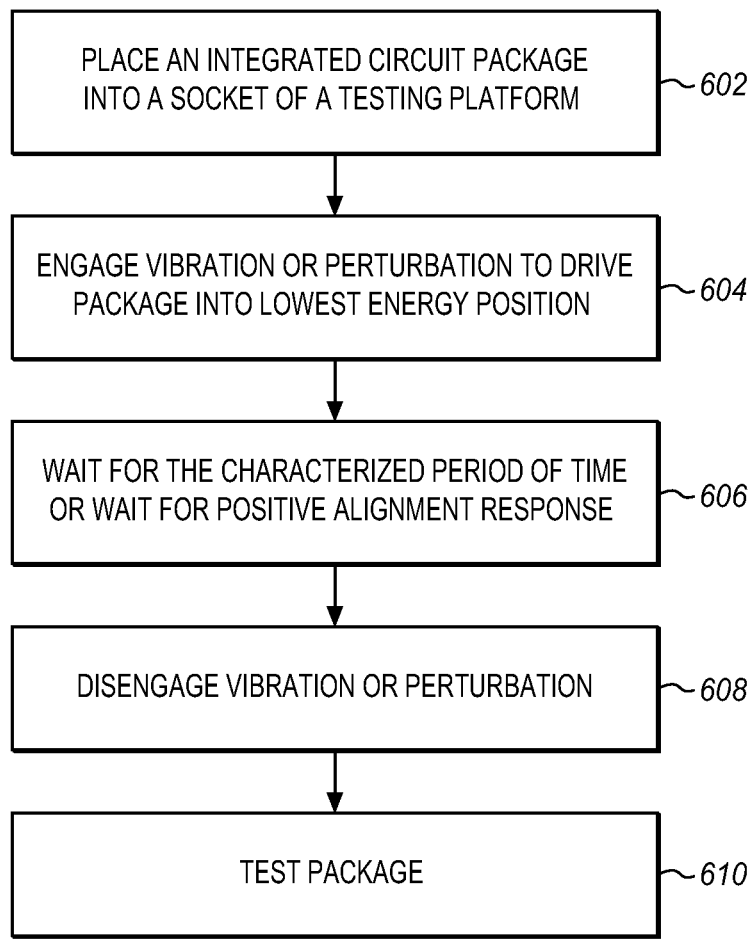
FIG. 6 is an alternative process flow diagram of placing an integrated circuit using perturbation according to an embodiment of the invention.

FIG. 6 is a more detailed example of a process flow diagram for operating a package alignment system as described herein. At 602, an integrated circuit package is placed into a socket of a testing platform. This may be done using a pick and place machine, or in any of a variety of other ways depending on the type of package and the socket.

At 604, the vibration or perturbation is engaged to drive the package into a lowest energy position. The perturbation of the silicon device allows the biasing features to guide the package into alignment. As mentioned above physical guides, pneumatic guides such as a vacuum, or any of a variety of other biasing techniques may be used.

At 606, alignment is detected. Alignment may be determined simply by waiting for a characteristic period of time. Alternatively the alignment of the package into the socket may be tested directly. The system may wait for a positive test response. The response may be an electrical response from the pins that have contacted the package solder balls. The response may a capacitive response measured between the pins or between a pin and a solder ball. The response may be from an optical detector such as a camera or photodetector directed to receive light between the pins and the solder balls.

For a vacuum biasing system, the response may be a change in vacuum. Referring to FIG. 3, a vacuum 238 has been applied to the socket pin shaft 236. Air flows from around the underside of the package 134 down the shaft. When the solder ball moves into the shaft and the underside of the package moves closer to the top of the shaft, the package will restrict air flow through the shaft. This will also increase the vacuum pressure. The vacuum pump will work harder to maintain the same air flow. The change in air flow, pressure, or vacuum pump power can be measured and used to determine whether the package has dropped into alignment. Other techniques may also be used to determine whether the package is aligned in the socket.

At 608, the perturbation is disengaged in response to the package alignment. The timer or alignment response signal may be coupled to a solenoid to disengage the perturbation or coupled to a controller. The controller may control the perturbation motor or some or all of the entire test system. At 610, the package is tested. In other words, the plan of record test program is applied to the DUT.

As described herein, a package may be aligned to a socket using simple and reliable approaches that may be used with very fine pitch alignment. The alignment equipment may be unobtrusively retrofitted to existing socket designs and test modules. The alignment process may be open loop. There is no need for active unit-sensing technologies. A timer may be used. For a closed loop system a simple inexpensive feedback sender may be used.

In addition, the perturbation also causes the solder bumps to move against the socket and the socket pins. This abrasion serves to remove contaminant and oxidation that may occur. The scraping of the pin tips against the solder-balls resulting in better electrical contact.

Figure 7:
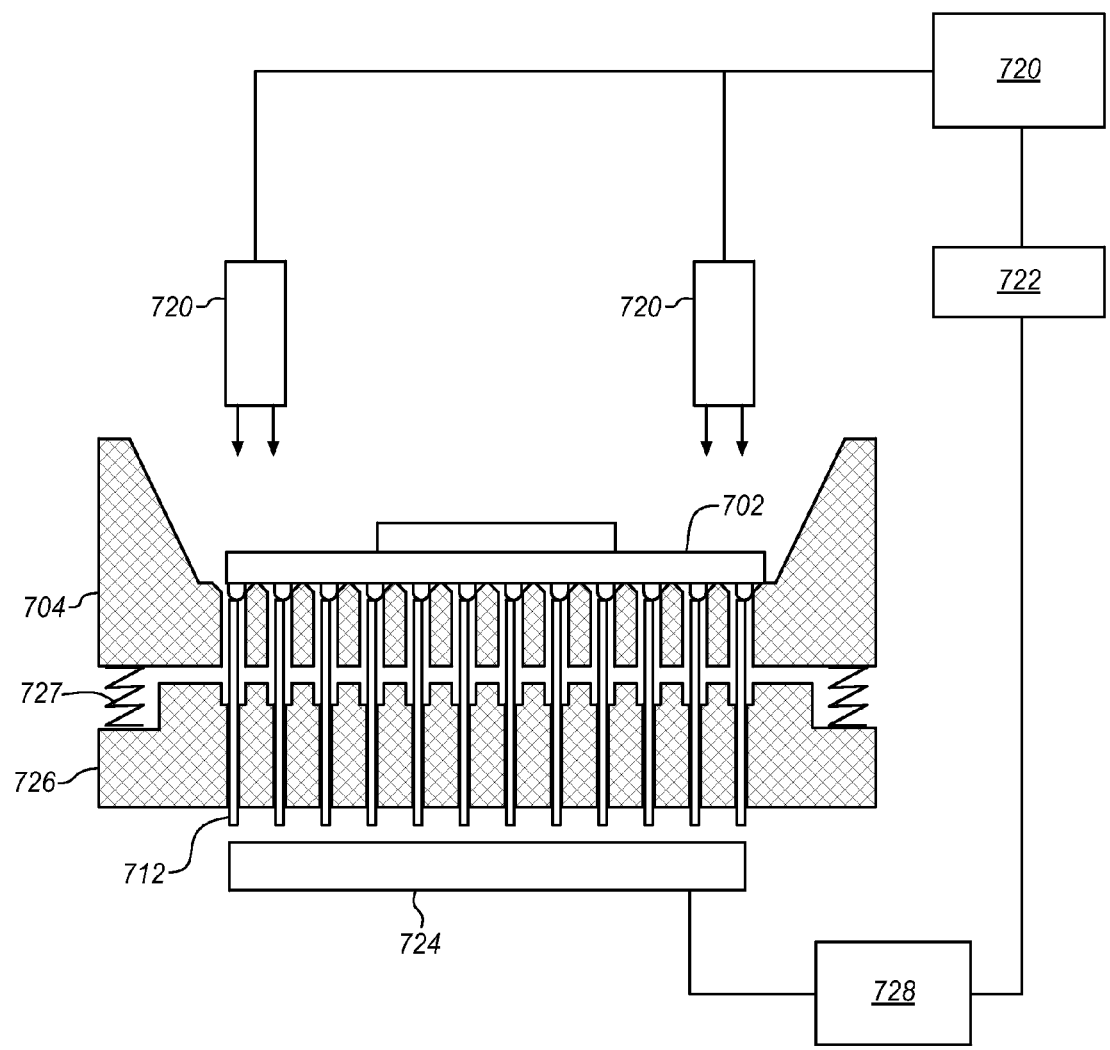
FIG. 7 is an alternative cross-sectional side view diagram of test system using a pneumatic perturbation system and a vacuum plate according to an embodiment of the invention.

FIG. 7 is a side cross-sectional diagram of a pneumatic perturbation system to align a package into a test socket. The package 702 is placed in a socket 704. The test system may have multiple sockets to simultaneously test many DUTs, the sockets may be mounted to a motherboard or a load board. The socket has an array of pins 712 to electrically connect with the solder bumps of the package.

In this example, a pneumatic system is used as for perturbation. Air nozzles 720 deliver puffs of air directed to the top of the package 702. The air puffs may be at the corners of the package as shown, at the sides of the package or in any other position. The nozzles may be off-center in order to induce horizontal motion as well as vertical motion for the package. The air puffs provide the perturbation to the package and ball guide system. The nozzles are connected to a compressor and valve system 720 that provides the puffs of air. The compressor and valves is controlled by a compressor controller 722. A single compressor may be coupled to multiple nozzles that are positioned over or directed at different packages in different sockets. In this way a larger test system may align multiple packages with a single compressor.

The socket 704 floats over a socket base 726 because it is mounted to the socket base with springs 727. The springs and the dowel pins allow the socket to move vertically, to connect the package to the pins, but the perturbation acts directly on the package. The movement of the package is not constrained and will be in all three directions.

The socket of FIG. 7, as in the example of FIG. 1 also has a package guide system and a ball guide system. The biasing feature in this example is a vacuum 724 below the socket operating as shown in FIG. 3. This may be combined with chamfers, angled guides, lead-ins, or any other construction or it may be used alone to guide the device into the socket.

In a conventional package guide system angled side walls 132 of the socket are used to guide the package into alignment with the socket pins. The angled side walls contact the outside edges 134 of the packet. If the packet edge contacts a side wall, then the side wall will push the package toward the middle of the socket.

The vacuum plate and pump 724 is coupled to a controller 728. When the package moves into alignment, then the vacuum pump detects a change in vacuum pressure. It generates an alignment signal that it sends to the controller 728. The controller then deactivates the air compressor 720 through a control connection to the compressor controller 722.

FIGS. 1, 4, and 7 present different perturbation systems combined with different biasing systems. However, the combinations may be changed depending on the particular implementation. The pneumatic perturbation may be combined with the mechanical beveled biasing. The drive coil perturbation may be combined with the vacuum biasing, etc. Different test sockets, different packages, and different test systems may be better or worse suited for different perturbation, different biasing, and different alignment detection systems. Accordingly, the different techniques described herein may be combined to provide a desired effect for each application.

Figure 8:
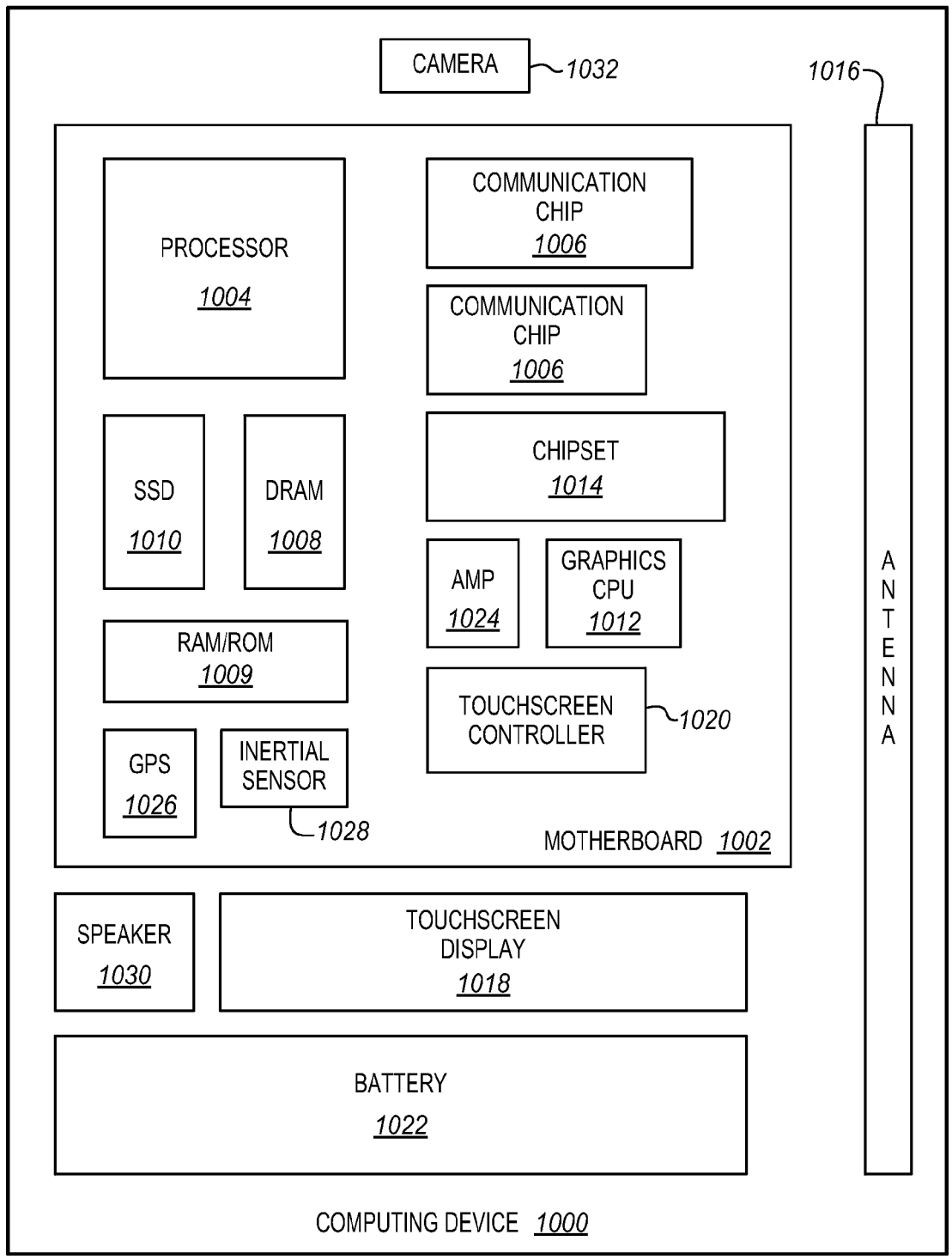
FIG. 8 is a block diagram of a computing device incorporating an embedded die package according to an embodiment.

FIG. 8 illustrates a computing device 1000 in accordance with one implementation of the invention. The computing device 1000 houses a board 1002. The board 1002 may include a number of components, including but not limited to a processor 1004 and at least one communication chip 1006. The processor 1004 is physically and electrically coupled to the board 1002. In some implementations the at least one communication chip 1006 is also physically and electrically coupled to the board 1002. In further implementations, the communication chip 1006 is part of the processor 1004.

Depending on its applications, computing device 1000 may include other components that may or may not be physically and electrically coupled to the board 1002. These other components include, but are not limited to, volatile memory (e.g., DRAM) 1008, non-volatile memory (e.g., ROM) 1009, flash memory (not shown), a graphics processor 1012, a digital signal processor (not shown), a crypto processor (not shown), a chipset 1014, an antenna 1016, a display 1018 such as a touchscreen display, a touchscreen controller 1020, a battery 1022, an audio codec (not shown), a video codec (not shown), a power amplifier 1024, a global positioning system (GPS) device 1026, a compass, accelerometer, a gyroscope and other inertial sensors 1028, a speaker 1030, a camera 1032, and a mass storage device (such as hard disk drive, or solid state drive) 1010, compact disk (CD) (not shown), digital versatile disk (DVD) (not shown), and so forth). These components may be connected to the system board 1002, mounted to the system board, or combined with any of the other components.

The communication chip 1006 enables wireless and/or wired communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

In some implementations, any one or more of the components of FIG. 8, such as the integrated circuit die of the processor, memory devices, communication devices, or other components may be SMT packages tested as described herein. The computing device may also be used a controller in the various applications described herein. The term "processor" may refer to any device or portion of a device that processes electronic data from registers and/or memory to transform that electronic data into other electronic data that may be stored in registers and/or memory.

In various implementations, the computing device 1000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

Embodiments may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

References to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

In the following description and claims, the terms "chip" and "package" are used interchangeably to refer to any type of microelectronic, micromechanical, analog, or hybrid small device that is suitable for use in a computing device.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to an apparatus. A socket is on the board for receiving and connecting to an integrated circuit package. The socket has an array of pins to engage connection bumps on a surface of the package and a biasing feature to guide the package into alignment with the pins of the socket. A perturbation source induces movement of the package into alignment with the pins of the socket.

In further embodiments, the circuit board is a load board having a plurality of sockets for testing a plurality of integrated circuit packages. In further embodiments, the socket has an established lowest energy position that coincides with alignment of the package with the pins of the socket and wherein the biasing feature induces movement from an initial position to the lowest energy position. In further embodiments, the biasing features comprises a vacuum and wherein the lowest energy position is defined with respect to a suction applied to the socket.

In further embodiments, the biasing features comprises an array of guides between the pins to guide the connection bumps of the package toward the pins. In further embodiments, the lowest energy position is defined with respect to gravity. In further embodiments, the perturbation source comprises an electric vibration source mechanically coupled to the socket such as an off-balanced motor, a voice coil, or a solenoid. In further embodiments, the perturbation source comprises compressed air.

Further embodiments include a feedback sensor to determine whether the package is in alignment with the socket and to generate an alignment signal in response to the determination, and a controller coupled to the feedback sensor to deactivate the perturbation source in response to the alignment signal.

In further embodiments, the feedback sensor is an electrical sensor coupled to at least one socket pin. In further embodiments, In further embodiments, the feedback sensor detects a change in vacuum pressure through the socket. In further embodiments, the feedback sensor causes the perturbation source to be turned off when alignment is detected.

Some embodiments pertain to placing an integrated circuit package into a socket of a testing platform, the socket being mounted to a circuit board of the testing platform, the socket having an array of pins to engage connection bumps on a surface of the package and a biasing feature to guide the package into alignment with the pins of the socket, and perturbing the socket to move the package to allow the biasing features to guide the package in a lowest energy position with respect to the socket, the lowest energy position corresponding to alignment with the pins of the socket.

In further embodiments, vibrating the socket comprises vibrating for a predetermined period of time. Further embodiments include further comprising receiving a feedback sensor signal and stopping vibrating the socket in response to receiving the feedback sensor signal. In further embodiments, the feedback signal is generated by at least one of an electrical response from pins of the socket, an optical sensor proximate the package, and a vacuum pressure sensor coupled to the socket. Some embodiments include testing the package through the socket using a test program of the testing platform.

Some embodiments pertain to placing an integrated circuit package into rough alignment with a fixture, the fixture to hold the package and having a biasing feature to guide the package into the fixture, and perturbing the package to allow the biasing features to guide the package into a lowest energy position with respect to the fixture, the lowest energy position corresponding alignment of the package with the fixture.

In further embodiments, perturbing the package comprises applying air puffs to the package through a pneumatic system. In further embodiments, the biasing feature is an air vacuum applied by a vacuum plate from beneath the fixture.

What is claimed is:

1. An apparatus comprising:
    a testing platform having a circuit board;
    a socket on the board for receiving and connecting to an integrated circuit package, socket having an array of pins to engage connection bumps on a surface of the package and a first biasing feature to contact outside edges of the package exterior to guide the package exterior into rough alignment with the socket and a second biasing feature to guide each bump into alignment with a respective pin of the socket;
    a perturbation source to induce movement of the package with respect to both the first and second biasing features into alignment with the pins of the socket;
    a feedback sensor to determine whether the package is in alignment with the socket and to generate an alignment signal in response to the determination; and
    a controller coupled to the feedback sensor to deactivate the perturbation source in response to the alignment signal.

2. The apparatus of claim 1, wherein the circuit board is a load board having a plurality of sockets for testing a plurality of integrated circuit packages.

3. The apparatus of claim 1, wherein socket has an established lowest energy position that coincides with alignment of the bumps of the package with the pins of the socket and wherein the second biasing feature includes chamfers at an end of the pins that induce movement of the connection bumps from an initial position to the lowest energy position.

4. The apparatus of claim 3, wherein the first biasing feature comprises a vacuum and wherein the lowest energy position is defined with respect to a suction applied to the socket.

5. The apparatus of claim 3, wherein the second biasing feature comprises an array of guides between the pins to guide the connection bumps of the package toward the pins.

6. The apparatus of claim 5, wherein the lowest energy position is defined with respect to gravity.

7. The apparatus of claim 1, wherein the perturbation source comprises an electric vibration source mechanically coupled to the socket.

8. The apparatus of claim 1, wherein the perturbation source comprises compressed air.

9. The apparatus of claim 1, wherein the second biasing features is applied to the bumps and wherein the second biasing feature guides the bumps after the package exterior is in rough alignment with the socket.

10. The apparatus of claim 1, wherein the feedback sensor is an electrical sensor coupled to at least one socket pin.

11. The apparatus of claim 1, wherein the feedback sensor detects a change in vacuum pressure through the socket.

12. The apparatus of claim 1, wherein the feedback sensor causes the perturbation source to be turned off when alignment is detected.

13. A method comprising:
    placing an integrated circuit package into a socket of a testing platform, the socket being mounted to a circuit board of the testing platform, the socket having an array of pins to engage connection bumps on a surface of the package, a first biasing feature contacting outside edges of the package exterior to guide the package exterior into rough alignment with the socket and a second biasing feature to guide each bump to guide the bumps into alignment with a respective pin of the socket;
    perturbing the socket to move the package to allow both the first and second biasing features to guide the package in a lowest energy position with respect to the socket, the lowest energy position corresponding to alignment with the pins of the socket;
    determining whether the package is in alignment with the socket using a sensor;
    generating an alignment signal in response to the determination; and
    deactivating the perturbation source in response to the alignment signal.

14. The method of claim 13, wherein vibrating the socket comprises vibrating for a predetermined period of time.

15. The method of claim 13, wherein the guiding the package with the second biasing feature comprises guiding each bump after the package exterior is in rough alignment with the socket.

16. The method of claim 13, wherein the feedback signal is generated by at least one of an electrical response from pins of the socket, an optical sensor proximate the package, and a vacuum pressure sensor coupled to the socket.

17. The method of claim 13, further comprising testing the package through the socket using a test program of the testing platform.

18. A method comprising:
    placing an integrated circuit package into rough alignment with fixture, the fixture to hold the package and having a first biasing feature to guide the package exterior into rough alignment with the fixture by contacting outside edges of the package exterior;
    perturbing the package after the package exterior is in rough alignment with the fixture to allow a second biasing feature applied to each connection bump of the package to guide each bump of the package into a lowest energy position with respect to the fixture, the lowest energy position corresponding to alignment of the connection bumps of the package with pins of the socket of the fixture;
    determining whether the package is in alignment with the socket using a sensor;
    generating an alignment signal in response to the determination; and
    deactivating the perturbation source in response to the alignment signal.

19. The method of claim 18, wherein perturbing the package comprises applying air puffs to the package through a pneumatic system.

20. The method of claim 18, wherein the biasing feature is an air vacuum applied by a vacuum plate from beneath the fixture.

* * * * *